United States Patent
Pendharkar

(10) Patent No.: US 7,187,033 B2
(45) Date of Patent: Mar. 6, 2007

(54) DRAIN-EXTENDED MOS TRANSISTORS WITH DIODE CLAMP AND METHODS FOR MAKING THE SAME

(75) Inventor: Sameer Pendharkar, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 142 days.

(21) Appl. No.: 10/890,648

(22) Filed: Jul. 14, 2004

(65) Prior Publication Data

US 2006/0011974 A1    Jan. 19, 2006

(51) Int. Cl.
*H01L 29/76* (2006.01)

(52) U.S. Cl. ............ 257/339; 257/335; 257/336; 257/342; 257/344; 257/328

(58) Field of Classification Search ........ 257/334–339, 257/328, 342, 344; 438/212, 268
See application file for complete search history.

(56) References Cited

U.S. PATENT DOCUMENTS

| | | | |
|---|---|---|---|
| 5,583,061 A * | 12/1996 | Williams et al. | ............ 438/275 |
| 5,852,314 A | 12/1998 | Depetro et al. | |
| 5,976,942 A | 11/1999 | Ludikhuize | |
| 6,194,761 B1 | 2/2001 | Chiozzi et al. | |
| 6,211,552 B1 | 4/2001 | Efland et al. | |
| 6,376,891 B1 | 4/2002 | Nagatani et al. | |
| 6,475,870 B1 | 11/2002 | Huang et al. | |
| 6,531,355 B2 | 3/2003 | Mosher et al. | |
| 6,548,874 B1 | 4/2003 | Morton et al. | |
| 6,573,562 B2 * | 6/2003 | Parthasarathy et al. | ..... 257/338 |
| 6,729,886 B2 | 5/2004 | Efland et al. | |
| 6,734,493 B2 | 5/2004 | Chen et al. | |
| 6,914,294 B2 * | 7/2005 | Nakamura et al. | .......... 257/328 |
| 2002/0053695 A1 | 5/2002 | Liaw et al. | |
| 2005/0073007 A1 | 4/2005 | Chen et al. | |

OTHER PUBLICATIONS

U.S. Appl. No. 10/880,907, filed Jun. 30, 2004, Pendharkar.

* cited by examiner

*Primary Examiner*—Thao X. Le
(74) *Attorney, Agent, or Firm*—Peter K. McLarty; W. James Brady, III; Frederick J. Telecky, Jr.

(57) ABSTRACT

High side extended-drain MOS driver transistors (T2) are presented in which an extended drain (108, 156) is separated from a first buried layer (120) by a second buried layer (130), wherein an internal or external diode (148) is coupled between the first buried layer (120) and the extended drain (108, 156) to increase the breakdown voltage.

11 Claims, 11 Drawing Sheets

DRAIN-EXTENDED MOS TRANSISTORS WITH DIODE CLAMP AND METHODS FOR MAKING THE SAME

FIELD OF INVENTION

The present invention relates generally to semiconductor devices and more particularly to extended-drain MOS transistor devices and fabrication methods for making the same.

BACKGROUND OF THE INVENTION

Power semiconductor products are often fabricated using N or P channel drain-extended metal-oxide-semiconductor (DEMOS) transistor devices, such as lateral diffused MOS (LDMOS) devices or REduced SURface Field (RESURF) transistors, for high power switching applications. DEMOS devices advantageously combine short-channel operation with high current handling capabilities, relatively low drain-to-source on-state resistance (Rdson), and the ability to withstand high blocking voltages without suffering voltage breakdown failure. Breakdown voltage is typically measured as drain-to-source breakdown voltage with the gate and source shorted together (BVdss), where DEMOS device designs often involve a tradeoff between breakdown voltage BVdss and Rdson. In addition to performance advantages, DEMOS device fabrication is relatively easy to integrate into CMOS process flows, facilitating use in devices where logic, low power analog, or other circuitry is also to be fabricated in a single integrated circuit (IC).

N-channel drain-extended transistors (DENMOS) are asymmetrical devices often formed in an n-well with a p-well (e.g., sometimes referred to as a p-body) formed in the n-well. An n-type source is formed within the p-well, where the p-well provides a p-type channel region between the source and an extended n-type drain. The extended drain typically includes an n-type drain implanted within the n-well, and a drift region in the n-well extending between the channel region and the drain. Low n-type doping on the drain side provides a large depletion layer with high blocking voltage capability, wherein the p-well is typically connected to the source by a p-type back-gate connection to prevent the p-well from floating, thereby stabilizing the device threshold voltage (Vt). The device drain region is spaced from the channel (e.g., extended) to provide a drift region or drain extension in the n-type semiconductor material therebetween. In operation, the spacing of the drain and the channel spreads out the electric fields, thereby increasing the breakdown voltage rating of the device (higher BVdss). However, the drain extension increases the resistance of the drain-to-source current path (Rdson), whereby DEMOS device designs often involve a tradeoff between high breakdown voltage BVdss and low Rdson.

DEMOS devices have been widely used for power switching applications requiring high blocking voltages, and high current carrying capability, particularly where a solenoid or other inductive load is to be driven. In one common configuration, two or four n-channel DEMOS devices are arranged as a half or full "H-bridge" circuit to drive a load. In a half H-bridge arrangement, two DEMOS transistors are coupled in series between a supply voltage VCC and ground with a load coupled from an intermediate node between the two transistors to ground. In this configuration, the transistor between the intermediate node and ground is referred to as the "low-side" transistor and the other transistor is a "high-side" transistor, wherein the transistors are alternatively activated to provide current to the load. In a full H-bridge driver circuit, two high-side drivers and two low-side drivers are provided, with the load being coupled between two intermediate nodes.

In operation, the high-side DEMOS has a drain coupled with the supply voltage and a source coupled to the load. In an "on" state, the high-side driver conducts current from the supply to the load, wherein the source is essentially pulled up to the supply voltage. Typical DEMOS devices are fabricated in a wafer having a p-doped silicon substrate with an epitaxial silicon layer formed over the substrate, where the substrate is grounded and the transistor source, drain, and channel (e.g., including the n-well and the p-well) are formed in the epitaxial silicon. In the on-state for the high-side DEMOS device, therefore, it is desirable to separate the p-well that surrounds the source from the underlying p-type substrate that is grounded, to prevent punch-thru current between the p-well and the substrate. Although the n-well may extend under the p-well, the n-well is typically only lightly doped, and therefore does not provide an adequate barrier to on-state punch-thru current from the source to the substrate. Accordingly, a heavily doped n-buried layer (e.g., NBL) is sometimes formed in the substrate prior to forming the epitaxial silicon layer to separate the n-well from the substrate, and to thereby inhibit on-state punch-thru current from the p-well to the substrate in high-side DEMOS drivers. The n-buried layer may be connected by a deep diffusion or sinker to the drain terminal in such high-side DEMOS devices, and hence is tied to the supply voltage so as to prevent or inhibit on-state punch-thru currents.

Although the n-buried layer operates to prevent on-state punch-thru current, the NBL limits the off-state breakdown voltage rating of high-side DEMOS drivers. In an "off" state, the high-side driver source is essentially pulled to ground while the low-side driver is conducting, wherein the drain-to-source voltage across the high-side DEMOS is essentially the supply voltage VCC. In high voltage switching applications, the presence of the n-buried layer under the p-well limits the drain-to-source breakdown of the device, since the n-buried layer is tied to the drain at VCC. In this situation, the p-well is at ground, since the source is low in the off-state, and the supply voltage VCC is essentially dropped across the n-well portion extending between the bottom of the p-well and the n-buried layer, and between the channel-side of the p-well and the drain. Furthermore, as the high-side driver is shut off when driving an inductive load, the transient drain-to-source voltage may increase beyond the supply voltage level VCC.

In these situations, the lateral spacing of the drain from the p-well may be adjusted to prevent p-well to drain breakdown. However, the vertical spacing between the bottom of the p-well and the n-buried layer is more difficult to increase. One approach is to increase the thickness of the epitaxial silicon layer. However, this is costly in terms of process complexity, particularly in forming the deep diffusions to connect the n-buried layer to the drain. Accordingly, there is a need for improved DEMOS devices and fabrication methods by which increased voltage breakdown withstanding capabilities can be achieved, without increasing epitaxial silicon thicknesses and without sacrificing device performance.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention relates to n or p-channel drain-extended MOS (DEMOS) transistors and fabrication methods in which an extended drain is separated from a first buried layer and coupled thereto by an internal or external diode. The invention facilitates increased breakdown voltage operation of high-side drivers and other DEMOS devices without requiring thicker epitaxial silicon layers and without adversely impacting Rdson, whereby increased driver operating voltages can be achieved with minimal changes to existing fabrication process flows. The first buried layer may be separated from the extended drain by a second buried layer of opposite conductivity type formed prior to epitaxial growth. The diode may be formed separately in the epitaxial layer with connections from an anode to the first buried layer and from a cathode to the extended drain being formed in interconnection or metalization layers, or external connections may be formed for coupling an external diode between the first buried layer and the extended drain.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
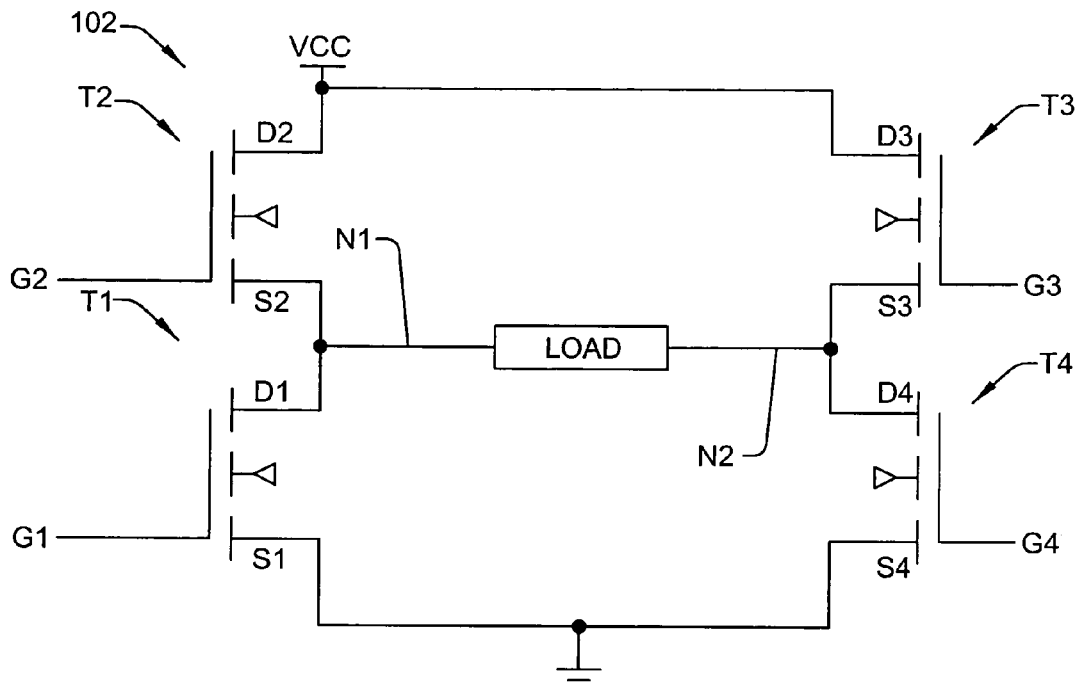
FIG. 1 is a schematic diagram illustrating a full H-bridge circuit device for driving a load using two pairs of low and high-side drain-extended NMOS devices in which one or more aspects of the invention may be implemented.

One or more implementations of the present invention will now be described with reference to the attached drawings, wherein like reference numerals are used to refer to like elements throughout, and wherein the illustrated structures are not necessarily drawn to scale. The invention provides improved DEMOS transistors and fabrication methods therefor, by which high breakdown voltage ratings can be achieved without increasing epitaxial silicon thickness, wherein a buried layer is diode coupled to an extended drain. The invention finds particular utility in high-side driver transistor applications in full or half-bridge circuits, although the transistors and methods of the invention are not limited to such applications. The various aspects of the invention are illustrated and described hereinafter in the context of NMOS driver transistors, although PMOS implementations are also possible, with p-doped regions being substituted for n-doped regions and vice versa. In addition, while the exemplary devices below are formed using a semiconductor body having a silicon substrate and an overlying epitaxial silicon layer, other semiconductor bodies may be used, including but not limited to standard semiconductor wafers, SOI wafers, etc., wherein all such variant implementations are contemplated as falling within the scope of the present invention and the appended claims.

Figure 6A:
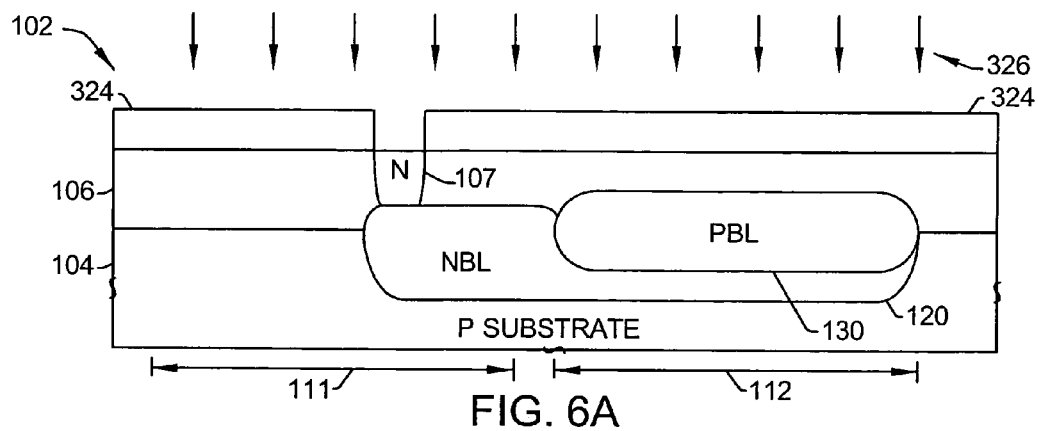
FIGS. 6A–6D are partial side elevation views in section illustrating another possible implementation of the high-side DENMOS driver transistor of FIG. 3A having external connections for coupling an external diode between the n-buried layer and the extended drain, shown at various stages of fabrication generally according to the method of FIG. 4.
Figure 6B:
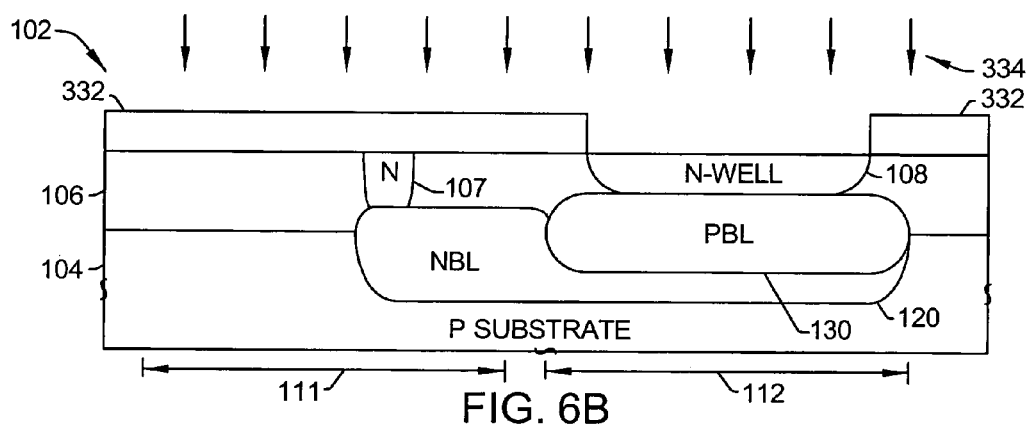
Figure 6C:
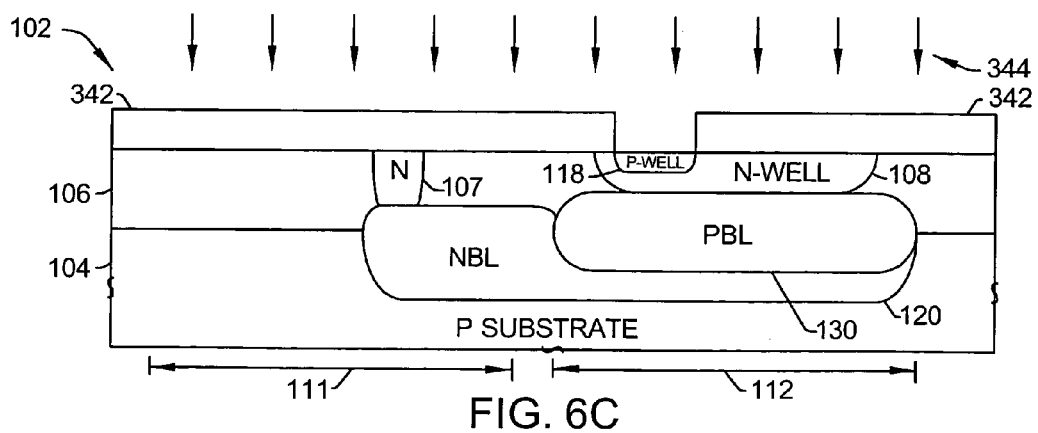
Figure 6D:
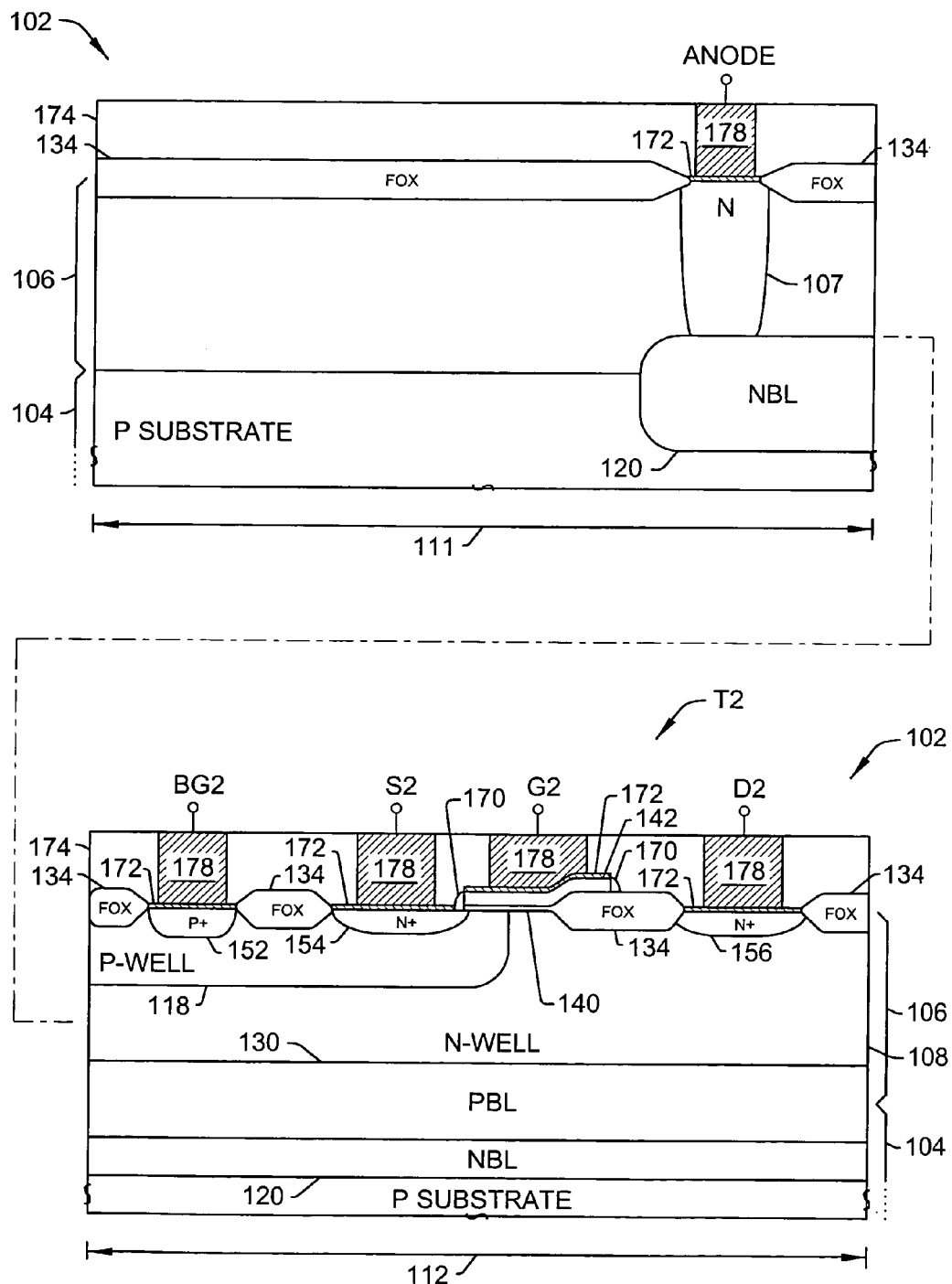

FIG. 1 illustrates a full H-bridge driver semiconductor device 102 powered by a DC supply voltage VCC, in which various aspects of the invention may be implemented. As illustrated and described further below with respect to FIG. 6E, the semiconductor device 102 may be constructed as a single IC 102a with four driver transistors T1–T4 and external connections for power, gate signals, and load terminals, and may optionally provide connection for external diodes for the high side-drivers T2 and/or T3. FIG. 6F illustrates another possible device 102b with a single high-side driver provided in an IC with external connections for drain, source, gate, back-gate, and optional anode connection. The invention may alternatively be employed in other integrated circuits having any number of components therein, where high breakdown voltage extended-drain MOS transistors are desired.

As illustrated in FIG. 1, the exemplary device 102 includes four n-channel drain-extended MOS (DENMOS) devices T1–T4 having corresponding sources S1–S4, drains D1–D4, and gates G1–G4, respectively, coupled in an H-bridge to drive a load coupled between intermediate nodes N1 and N2. The transistors T1–T4 are arranged as two pairs of low and high-side drivers (T1 & T2, and T4 & T3) with the load coupled between the intermediate nodes of the two pairs, thereby forming an "H-shaped" circuit. A half-bridge driver circuit could be implemented using the transistors T1 and T2, with the right hand node N2 of the load being coupled to ground, wherein T3 and T4 would be omitted. In one example, the supply voltage VCC can be a positive terminal of a battery source and the ground may be the battery negative terminal in automotive applications, portable electronic devices, etc.

On the left side of the H-bridge in FIG. 1, a low-side driver T1 and a high-side driver T2 are coupled in series between the supply voltage VCC and ground, and the other pair T4 and T3 are similarly connected. The high side driver transistor T2 has a drain D2 coupled to VCC and a source S2 coupled with an intermediate node N1 at the load. The low-side transistor T1 has a drain D1 coupled to the node N1 and a source S1 coupled to ground. The node N1 between the transistors T1 and T2 is coupled to a first terminal of a load and the other load terminal N2 is coupled to the other transistor pair T3 and T4, wherein the load is typically not a part of the device 102. The high and low side transistor gates G1–G4 are controlled so as to drive the load in alternating fashion. When the transistors T2 and T4 are on, current flows through the high-side transistor T2 and the load in a first direction (to the right in FIG. 1), and when the transistors T3 and T1 are both on, current flows through the load and the low-side transistor T1 in a second opposite direction.

Figure 2A:
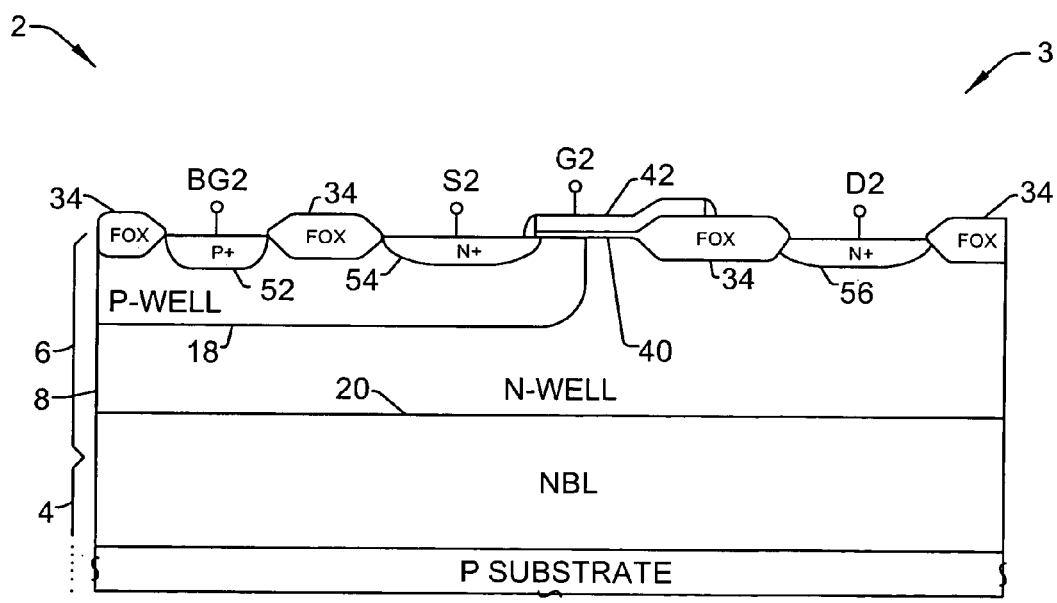
FIG. 2A is a partial side elevation view in section illustrating a conventional high-side DENMOS transistor.
Figure 2B:
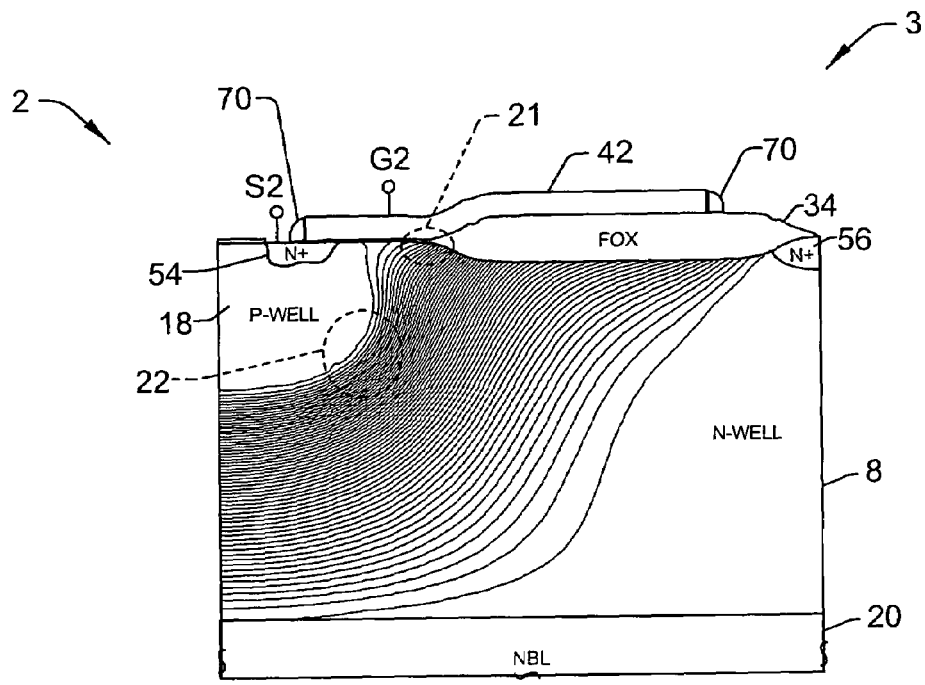
FIG. 2B is a side elevation view of the conventional high-side transistor of FIG. 2A, illustrating equipotential voltage lines in the drift region and areas prone to breakdown at high drain-to-source voltages in an off-state.

In order to appreciated one or more shortcomings of conventional DEMOS transistors in applications such as the H-bridge of FIG. 1, FIGS. 2A and 2B illustrate a semiconductor device 2 with a conventional high-side DENMOS transistor 3, wherein FIG. 2B illustrates equipotential voltage lines in a drift region of the high-side driver 3 in an off-state to illustrate the breakdown voltage limitations thereof. The conventional high-side driver transistor 3 is briefly described hereinafter in the context of H-bridge driver circuits to facilitate an appreciation the possible advantages of the present invention, wherein the DENMOS transistor 3 can be coupled to drive a load in a full or half-bridge driver circuit configuration, such as T2 in the H-bridge circuit of FIG. 1.

As illustrated in FIG. 2A, the device 2 includes a p-doped silicon substrate 4 over which an epitaxial silicon layer 6 is formed. An n-buried layer (NBL) 20 is located in the substrate 4 beneath the high-side device 3 and extends partially into the epitaxial silicon 6. An n-well 8 is implanted with n-type dopants in the epitaxial silicon 6 above the n-buried layer 20, and a p-well or p-body 18 is formed within the n-well 8. Field oxide (FOX) isolation structures 34 are formed in the upper portion of the epitaxial silicon 6 between transistor device terminals of the low and high side transistors 1 and 3. A p-type back gate 52 and an n-type source 54 are formed in the p-well 18, and an n-type drain 56 is formed in the n-well 8. A gate structure is formed over a channel portion of the p-well 18, including a gate oxide 40 and a gate electrode 42, wherein the gate G2, source S2, and drain D2 of the conventional high-side DENMOS transistor 3 are labeled as if coupled to form a half or full H-bridge as in FIG. 1 above for illustrative purposes.

In such a driver application, the high-side device drain 56 is connected to the supply voltage VCC and the source 54 is coupled to the load at the intermediate node N1. When the high side transistor 3 is on, both the source 54 and the drain 56 are at or near the supply voltage VCC, wherein the n-buried layer 20 helps to prevent punch-thru current from flowing between the p-well 18 and the grounded p-type substrate 4, wherein the n-buried layer 20 is tied to the drain 56 (e.g., to VCC). However, when the high-side transistor 3 is off, the source 54 is essentially pulled to ground via the low-side transistor, whereby the drain-to-source voltage across the high-side DENMOS 3 is essentially the supply voltage VCC. Moreover, when switching from the on-state to the off-state, the high-side driver 3 may experience transient drain-to-source voltages greater than VCC where the load is inductive. FIG. 2B illustrates equipotential voltage lines in the drift region of the n-well 8 in the high-side transistor 3 in the off-state. At such high drain-to-source voltage levels, high electric fields are generated in regions 21 and 22 in which the equipotential lines are closely spaced, wherein the high-side driver 3 is illustrated in FIG. 2B at a Vds just below the breakdown level.

The inventor has appreciated that these regions 21 and 22 are susceptible to breakdown at higher supply voltages in the high-side driver off-state due at least in part to the n-buried layer 20 located beneath the n-well 8, wherein the breakdown voltage BVdss of the illustrated conventional DENMOS 3 is relatively low. Thus, while the n-buried layer 20 inhibits on-state punch-thru current from the p-well 18 to the substrate 4, the off-state breakdown voltage BVdss of the high-side driver 3 is limited by the presence of the NBL 20. In this regard, the inventor has appreciated that the presence of the n-buried layer 20 at the drain potential (VCC) contributes to the equipotential line crowding of FIG. 2C at high drain-to-source voltage levels, particularly in the regions 21 and 22 of FIG. 2C. Absent design changes, the supply voltage VCC cannot be increased without risk of off-state or transient voltage breakdown. One approach is to decrease the dopant concentration of the n-well 8 for improved breakdown voltage performance. However, this approach adversely impacts the on-state drive current by increasing Rdson. Another approach is to increase the thickness of the epitaxial silicon layer 6. However, as discussed above, fabricating a thicker epitaxial layer 6 causes process complications, and may not be feasible beyond a certain amount.

Figure 3A:
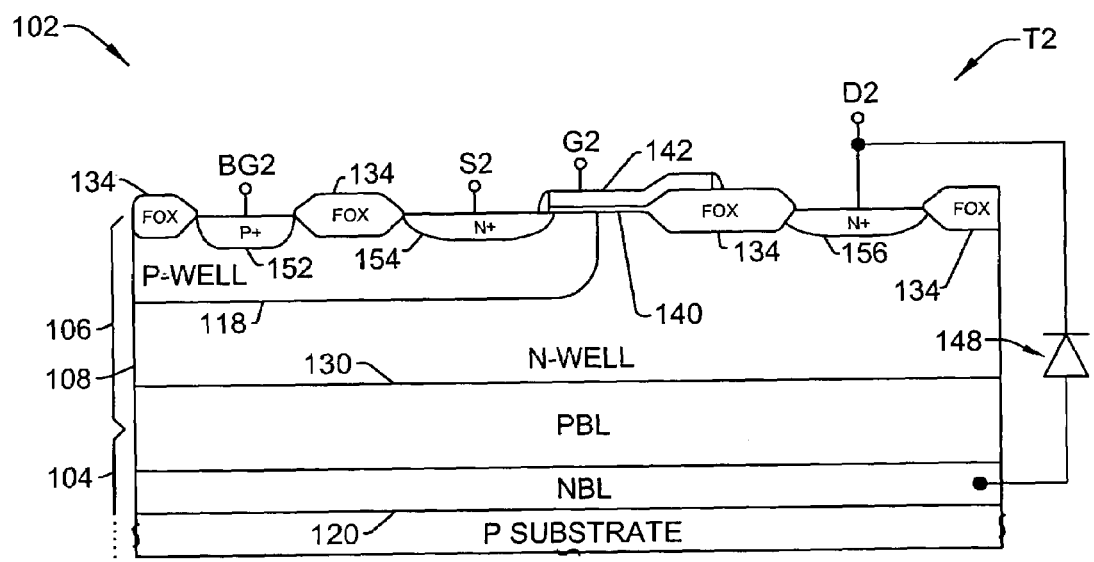
FIG. 3A is a partial side elevation view in section illustrating an exemplary high-side DENMOS transistor with a p-buried layer separating an extended drain from an underlying n-buried layer, as well as a diode clamp coupling the n-buried layer with the extended drain in accordance with one or more aspects of the present invention.
Figure 3B:
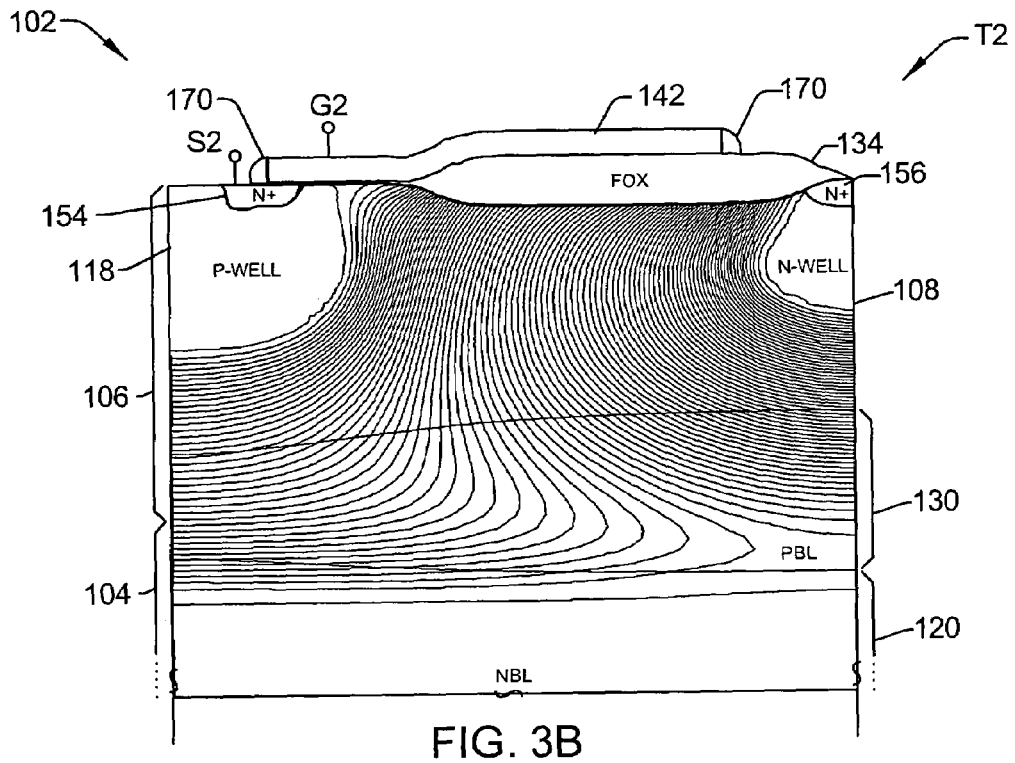
FIG. 3B is a side elevation view of the exemplary high-side DENMOS transistor of FIG. 3A, illustrating equipotential voltage lines in the drift region in an off-state.
Figure 3C:
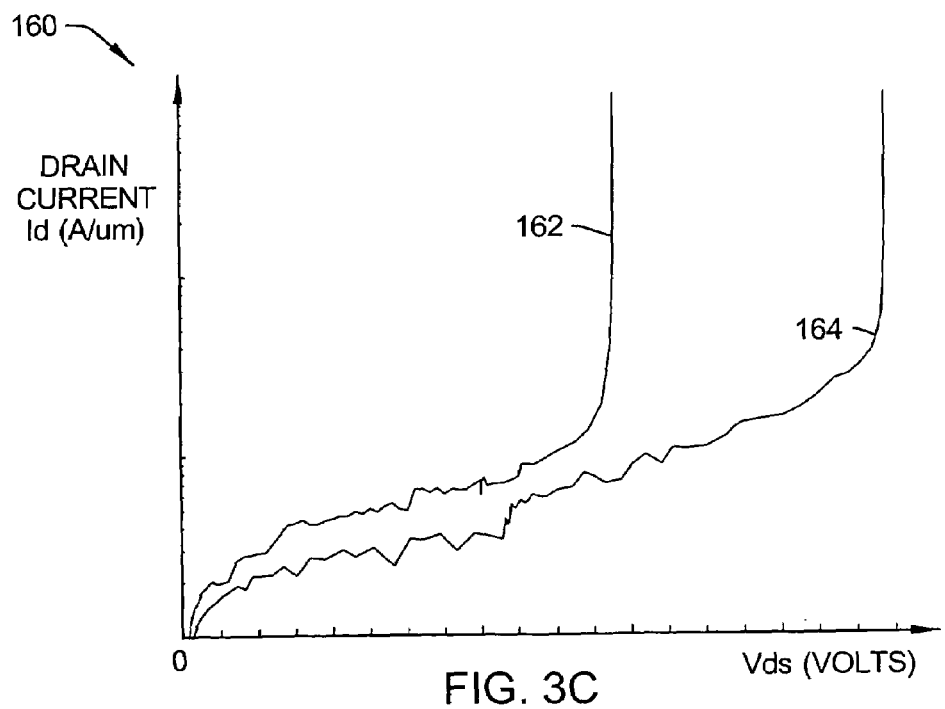
FIG. 3C is a graph illustrating drain current (Id) vs. drain-to-source voltage (Vds) curves to illustrate comparative breakdown voltage performance for the high side DENMOS driver transistors of FIGS. 2A and 3A.

The present invention provides DEMOS transistors that facilitate improved breakdown voltage ratings without increasing Rdson or the epitaxial silicon layer thickness. The invention thus facilitates use of such devices in new applications requiring higher supply voltages, including but not limited to full or half H-bridge configurations as in FIG. 1, while avoiding or mitigating the usual tradeoff between Rdson and BVdss in drain-extended MOS devices, and without significant alteration of existing fabrication process flows. FIGS. 3A–3C illustrate an exemplary DENMOS high-side driver transistor T2 in the H-bridge driver device 102 of FIG. 1, wherein an n-buried layer 120 is separated from an extended drain of the device by a p-buried layer 130, and wherein a diode 148 is coupled between the n-buried layer 120 and the drain to increase the breakdown voltage, without the need to increase epitaxial thickness. Although illustrated in the context of DENMOS high-side drivers formed in a semiconductor body having a silicon substrate and an overlying epitaxial silicon layer, other implementations are possible within the scope of the invention, for example, PMOS implementations, devices fabricated using other semiconductor body structures, other drain-extended MOS transistors (e.g., RESURF devices, etc.), and/or transistors not employed in high-side driver applications. Furthermore, as discussed below, the diode 148 may be integrated in the device 102 or may be external.

As illustrated in FIG. 3A, the device 102 is formed in a semiconductor body comprising a p-doped silicon substrate 104 and an epitaxial silicon layer 106 formed over the substrate 104. Prior to formation of the epitaxial silicon 106, an n-buried layer (NBL) 120 is formed (e.g., implanted and diffused) in the substrate 104 beneath a prospective high-side driver region thereof, and a p-buried layer (PBL) 130 is formed (e.g., implanted) above the n-buried layer of the high-side driver region, whereby the p-buried layer 130 is situated between the n-buried layer 120 and the overlying high-side DENMOS transistor T2, wherein some of the implanted p-type dopants of the p-buried layer 130 may diffuse upward into the epitaxial silicon 106 during epitaxial growth thereof and/or during subsequent fabrication processing steps in which thermal energy is provided to the device 102. In addition, the p-buried layer 130 may prevent or inhibit upward diffusion of n-type dopants of the n-buried layer 120 during such thermal processing.

The transistor T2 also comprises an n-well 108 implanted with n-type dopants (e.g., arsenic, phosphorus, etc.) in the epitaxial silicon 106, as well as a p-well or p-body 118 formed within the n-well 108, with field oxide (FOX) structures 134 formed in the upper portion of the epitaxial silicon 106 between transistor source, drain, and back gate terminals. Other implementations are possible, for example, where the back gates may be connected directly to the sources, where the isolation structures are formed using shallow trench isolation (STI) techniques, deposited oxide, etc., wherein all such alternative implementations having a first buried layer (e.g., NBL 120) separated from the DEMOS by a second buried layer of opposite conductivity type (e.g., PBL 130), with a diode (e.g., diode 148) coupled therebetween are contemplated as falling within the scope of the invention and the appended claims.

The transistor T2 comprises a p-type back gate 152 and an n-type source 154 formed in the p-well 118, as well as an n-type drain 156 formed in the n-well, wherein a portion of the n-well 108 between the drain 150 and the p-well 118 provides a drain extension or drift region. Thus, the transistor T3 includes an extended drain comprising the drift region of the n-well 108 and the drain 56. In operation, the back gate 152 may, but need not, be coupled to the source 154 in an overlying metalization layer (not shown). In one possible alternative implementation, the field oxide (FOX) structure 134 between the back gate 152 and the source 154 may be omitted for direct connection of the back gate 152 to the source 154. A gate structure is formed over a channel portion of the p-well 118 and over a portion of a drift region of the n-well 108, including a gate oxide 140 and a gate electrode 142, where a portion of the gate electrode 142 is further extended over a field oxide structure 134 above the drain extension or drift region of the n-well 108 in the exemplary transistor T2.

In a half or full H-bridge load driver configuration, the drain 156 is connected to the supply voltage VCC together with the cathode of the internal or external diode 148, and the source 154 is coupled to the load at the intermediate node N1 in FIG. 1. In the on-state of the high side DENMOS transistor T2, the source 154 is pulled to near the supply voltage VCC, wherein the n-buried layer 120 helps to prevent punch-thru current from flowing between the p-well 118 and the grounded p-type substrate 104. In the off-state, the majority of the supply voltage VCC appears between the drain 156 and the source 154. However, unlike the conventional high-side drivers in which an n-buried layer (e.g., NBL 20 in FIG. 2A) was coupled to the drain, the n-buried layer 120 in the exemplary device 102 is separated from the extended drain (e.g., separated from the drain 156 and the drift region of the n-well 108) by the p-buried layer 130, wherein the diode 148 is coupled between the n-buried layer 120 and the extended drain. Accordingly, the off-state voltage potential of the n-buried layer 120 is lower than VCC.

The lower n-buried layer potential and the presence of the intervening p-buried layer result in much different electric field profiles in the device during the off-state compared with those of conventional high-side drivers. FIG. 3B illustrates the high-side device T2 at a high drain-to-source voltage that is about 60 percent higher than that of FIG. 2B above with no voltage breakdown, where the n-buried layer 120 is at a lower voltage than the drain 156, wherein a portion of the supply voltage appears across the diode 148. In this example, the design parameters (e.g., dimensions, dopant concentrations, etc.) of the exemplary high-side DENMOS transistor T2 are essentially the same as the conventional device 3 of FIG. 2A, with the addition of the p-buried layer 130 and the diode 148. Thus, the addition of the p-buried layer 130 and the diode coupling of the n-buried layer 120 and the extended drain facilitates operation at higher supply voltages VCC without suffering off-state voltage breakdown, wherein BVdss is significantly increased without increasing the epitaxial silicon thickness, and without changing Rdson.

FIG. 3C provides a graph 160 illustrating drain current (Id) vs. drain-to-source voltage (Vds) curves 162 and 164 for the conventional high-side DENMOS 3 of FIG. 2A and the exemplary high-side DEMOS transistor T2 of FIG. 3A, respectively. As can be seen in the graph 160, the transistor T3 of FIG. 3A can be safely operated at much higher voltages without breakdown, wherein the corresponding BVdss 164 is more than 60 percent higher than the BVdss 162 of the conventional high-side DENMOS 3 of FIG. 2A. Thus, the separation of the n-buried layer 120 from the extended drain 156, 108, and the coupling of the diode 148 therebetween provides significantly higher breakdown voltage, allowing use with higher supply voltages VCC without increasing the thickness of the epitaxial silicon layer 106, and without significant adverse impact on Rdson.

In a preferred implementation, the dopant concentration of the n-buried layer 120 is higher than that of the p-buried layer 130, so as to inhibit on-state punch-thru current from flowing between the p-well 118 and the p-type substrate 104 when the n-well 108 is depleted between the p-well 118 and the p-buried layer 130. In one example, the p-buried layer 130 has a peak dopant concentration of about $5E15$ $cm^{-3}$ or more and about $5E17$ $cm^{-3}$ or less, wherein the n-buried layer 120 has a peak concentration of about $1E17$ $cm^{-3}$ or more and about $1E20$ $cm^{-3}$ or less, with the n-buried layer peak concentration being higher than that of the p-buried layer 130.

Another aspect of the invention provides methods for semiconductor device fabrication, which may be used to fabricate devices having NMOS and/or PMOS extended drain transistors having improved breakdown voltage performance. In this aspect of the invention, a first buried layer of a first conductivity type is implanted in a substrate, and a second buried layer of a second conductivity type is then implanted. An epitaxial silicon layer is formed over the implanted substrate, and a drain-extended MOS transistor is formed above the second buried layer in the epitaxial silicon layer, where an extended drain of the transistor is separated from the first buried layer. The method may include forming a diode in the epitaxial layer to couple the first buried layer to the extended drain, or forming external connections to the first buried layer and the extended drain for coupling an external diode therebetween.

Figure 4:
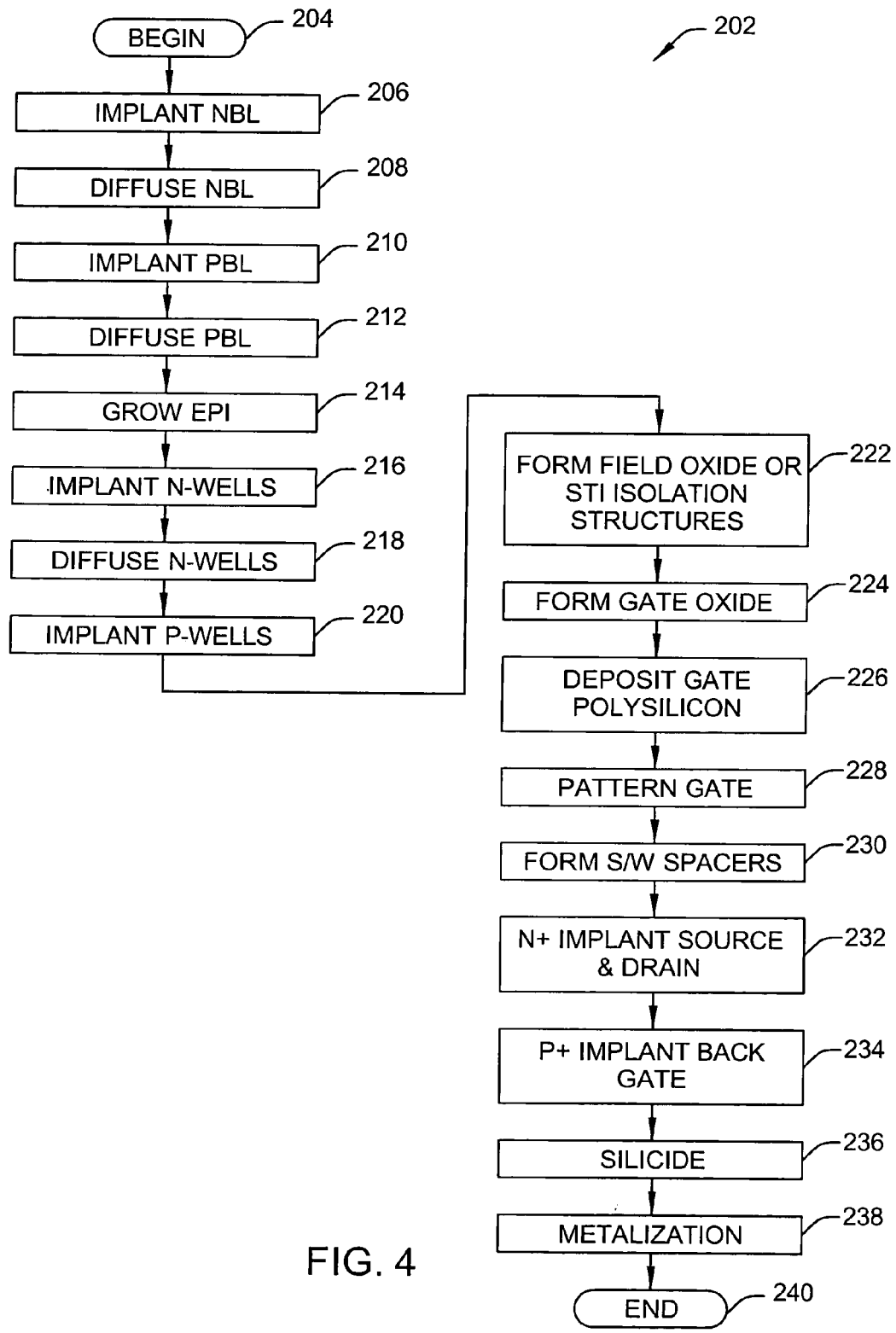
FIG. 4 is a flow diagram illustrating an exemplary method of fabricating a semiconductor device and high-side DENMOS driver transistors thereof in accordance with the invention.

FIG. 4 illustrates an exemplary method 202 for fabricating a semiconductor device and DEMOS transistors in accordance with this aspect of the invention, and FIGS. 5A–5H illustrate the exemplary semiconductor device 102 at various stages of fabrication generally in accordance with the method 202 of FIG. 4 in the case where an internal diode 148 is provided. FIGS. 6A–6D illustrate fabrication of another implementation of the device 102 and of the method 202, wherein connections are provided for an external diode 148. Other methods of the invention may be employed in forming PMOS devices, with p-type dopants being substituted for n-type dopants and vice versa. In addition, the method 202 may be employed in forming devices with internal diodes for coupling a first buried layer to an extended drain of the DEMOS transistor and/or in producing devices with externally accessible connections for coupling an external diode between the first buried layer and the extended drain, wherein all such alternate implementations are contemplated as falling within the scope of the invention and the appended claims.

While the exemplary method 202 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication of devices which are illustrated and described herein as well as in association with other devices and structures not illustrated.

Figure 5A:
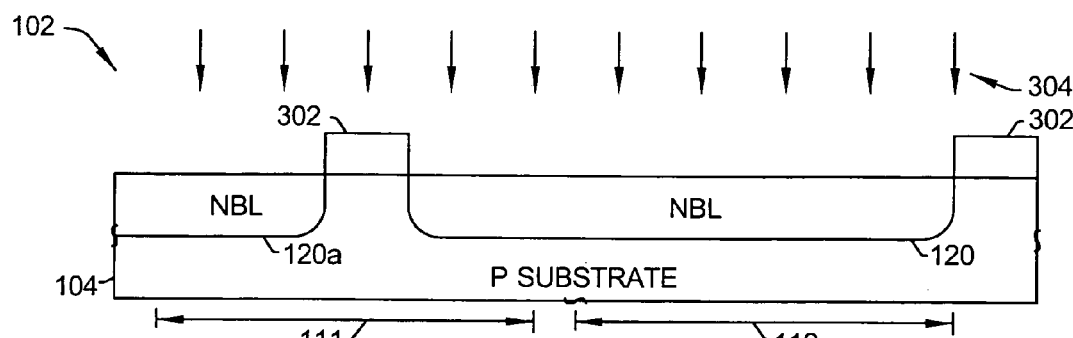
FIGS. 5A–5H are partial side elevation views in section illustrating an exemplary implementation of the high-side DENMOS driver transistor of FIG. 3A having an internal diode coupling the n-buried layer with the extended drain, shown at various stages of fabrication generally according to the method of FIG. 4.

The method 202 begins at 204 in FIG. 4, with an n-buried layer (e.g., NBL) being implanted at 206 in a substrate, which may optionally be diffused at 208. In the exemplary semiconductor device 102, an n-buried layer 120 is provided in a driver region 112 for the high-side device T2, and may also be implanted elsewhere in the device 102, including a separate n-buried layer 120a in a diode region 111. In FIG. 5A, the device 102 is illustrated with an NBL implant mask 302 formed over portions of the silicon substrate 104 to expose a portion of the upper surface of the substrate 104 in the prospective high-side driver region 112 while covering a portion of the prospective internal diode region 111. An implantation process 304 is performed with the mask 302 in place to implant n-type dopants (e.g., phosphorus, arsenic, etc.) into the exposed portions of the substrate 104, thereby forming the n-buried layer 120 in the driver region 112 (e.g., a first buried layer of a first conductivity type) as well as a separate n-buried layer 120a in the diode region 111. A diffusion anneal (not shown) may optionally be performed at 208 to drive the n-type dopants further into the substrate 104, thereby extending the n-buried layers 120, 120a downward and laterally outward from the initial implanted region.

Figure 5B:
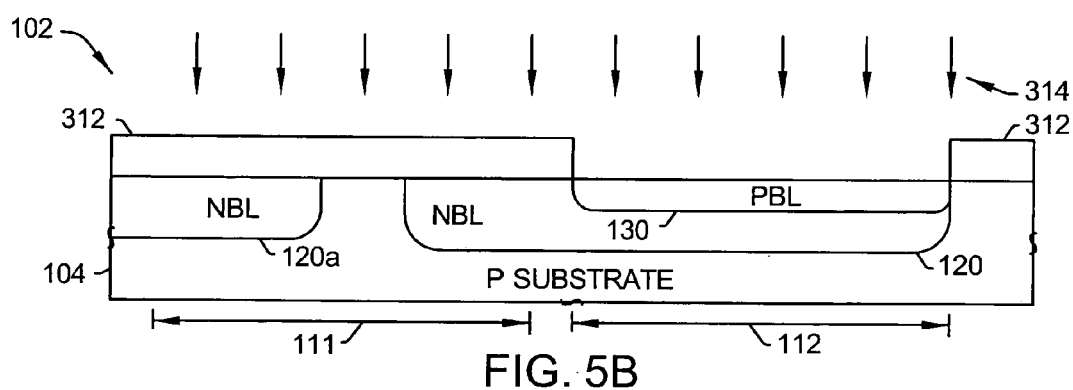

At 210 in FIG. 4, a second buried layer of a second conductivity type is implanted (e.g., the p-buried layer 130 in the device 102), which may optionally be diffused at 212. In FIG. 5B, a mask 312 is formed, which exposes portions of the n-buried layer 120 in the prospective high-side region 112, and an implantation process 314 is performed to provide p-type dopants (e.g., boron, etc.) into the exposed portions of the substrate 104. As illustrated in FIG. 5B, the exemplary p-buried layer 130 in the high-side region 112 is located within the n-buried layer 120 in the device 102, wherein another diffusion anneal may optionally be performed at 212 to drive the implanted p-type dopants laterally and downward, thereby extending the p-buried layer 130.

Figure 5C:
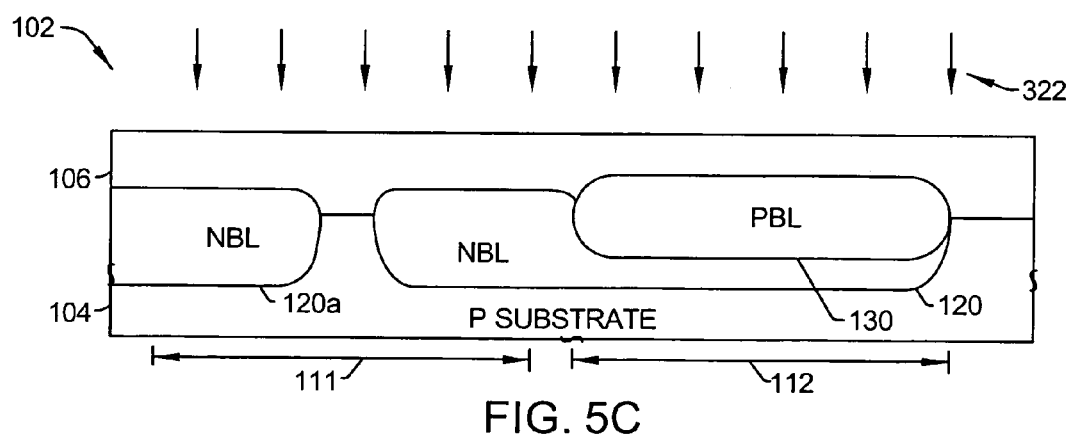

At 214 in FIG. 4, an epitaxial growth process is performed to grow an epitaxial silicon layer 106 over the substrate 104. Any suitable epitaxial growth processing may be employed at 214 by which an epitaxial silicon layer 106 is formed over the upper surface of the substrate 104. In FIG. 5C, an epitaxial silicon layer 106 is formed over the substrate 104 via a process 322, wherein thermal energy associated with the epitaxial growth process 322 causes upward diffusion of a portion of the p-type dopants of the p-buried layer 130, whereby a portion of the p-buried layer 130 extends into the epitaxial silicon 106. Similarly, an end portion of the n-buried layer 120 may diffuse upward into the epitaxial silicon 106 outside the high-side driver region 112, and the diode region n-buried layer 120a also extends upward into the epitaxial silicon 106. However, the p-buried layer 130 generally prevents or inhibits upward diffusion of at least a portion of the n-buried layer 120 in the high-side driver region 112, both during the epitaxial process 322 at 214 and afterwards, and provides a physical barrier between the n-buried layer 120 and a subsequently formed extended drain of the DEMOS (e.g., drain 156 and n-well 108 in FIG. 3A).

Figure 5D:
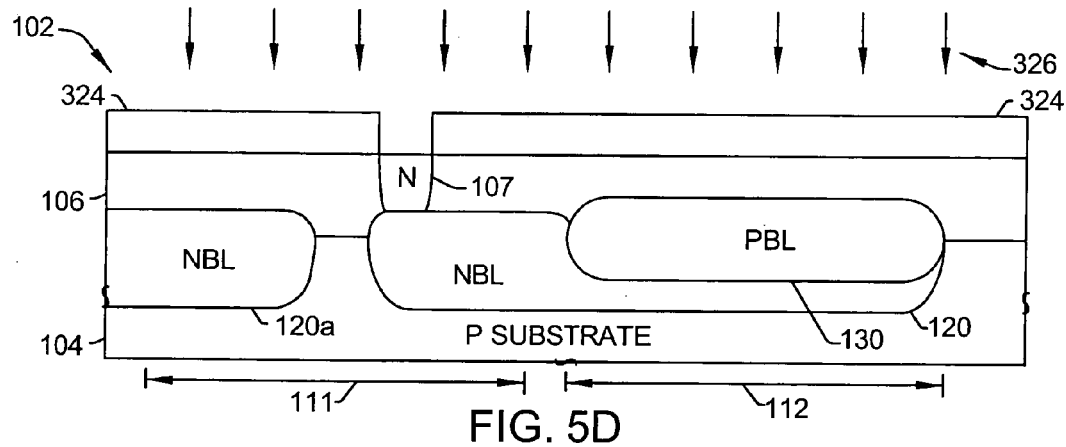
Figure 5E:
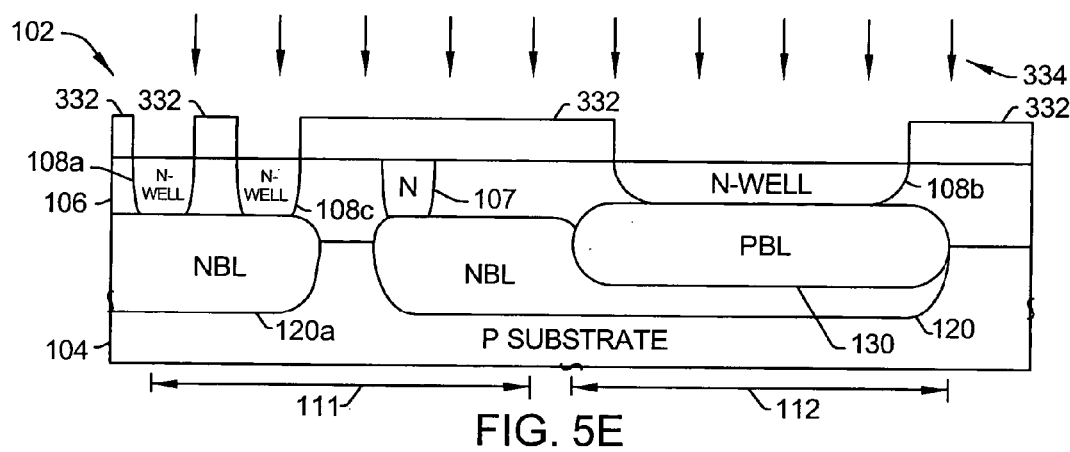

At 216, n-wells are implanted in the epitaxial silicon 106 in the high-side region 112, which may then be thermally diffused at 218. A deep n-type diffusion (e.g., a sinker) is formed in the epitaxial silicon 106, either before or after the n-well formation at 216, to provide connection to the n-buried layer 120. In FIGS. 5D and 6A, a mask 324 is formed over the epitaxial layer 106 and an n-type implantation 326 is performed along with a thermal diffusion anneal (not shown) to create an n-type sinker 107 connection to the n-buried layer 120 in the region 111. A mask 332 is formed in FIGS. 5E and 6B that exposes all or a portion of the prospective high-side driver region 112, and an implantation 334 is performed to create the n-wells 108 therein (e.g., n-wells 108a–108c in FIGS. 5E and n-well 108 in FIG. 6B). In the case where an internal diode 148 is to be formed in the device 102, the mask 332 exposes two portions of the diode region 111, as shown in FIG. 5E, whereby the implantation at 218 creates cathode n-wells 108a and 108c extending down to the n-buried layer 120a in the diode region 111, and also creates the DEMOS n-well 108b in the high-side driver region 112, after which thermal diffusion annealing may be employed at 218.

Figure 5F:
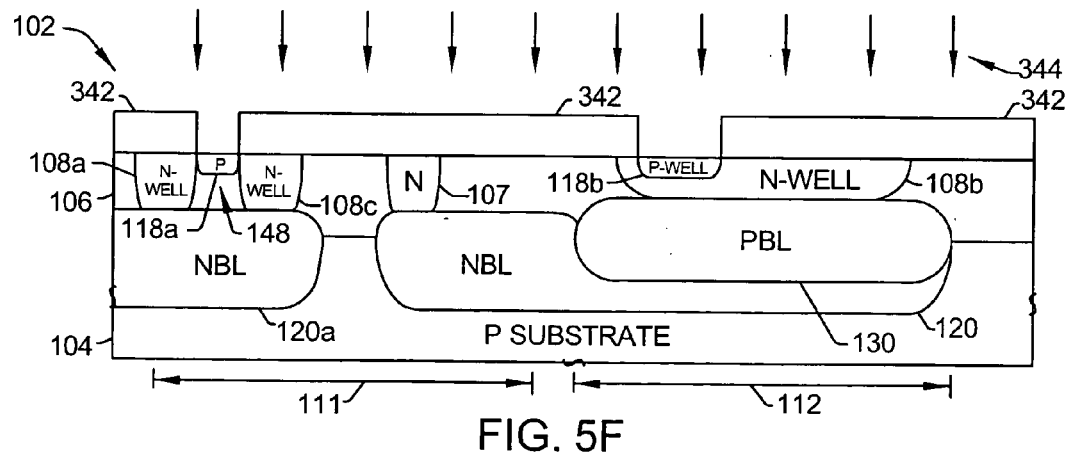

At 220, p-wells or p-base regions 118 are implanted into portions of the transistor n-well 108, which may be followed by another thermal diffusion anneal (not shown). FIG. 5F illustrates the case for an internal diode 148, wherein a mask 342 is formed to expose prospective p-well regions of the epitaxial layer 106 in the DEMOS n-well 108b and also in the diode region 112 between the n-wells 108a and 108c. An implantation process 344 is then performed to create an anode p-well 118a, thereby creating an internal diode 148 in the epitaxial layer 106, as well as the transistor p-well 118b, wherein the n-wells 108b extend beneath the p-well 118b between the p-well 118b and the p-buried layer 130. In this configuration, the n-wells 108a and 108c, as well as the diode region n-buried layer 120a serve to isolate the diode p-well 118a from the remainder of the epitaxial layer 106 and from the p-substrate 104. FIG. 6C illustrates the case where an external diode 148 is to be used, wherein a single p-well 118 is created in the transistor n-well 108, wherein the mask 342 covers the region 111. Any suitable implantation processes may be employed in forming the buried layers 120, 130, and the wells 108, 118 within the scope of the invention, with dedicated diffusion anneals optionally being performed following any, all, or none of the implants, wherein all such variant implementations are contemplated as falling within the scope of the invention and the appended claims.

Figure 5G:
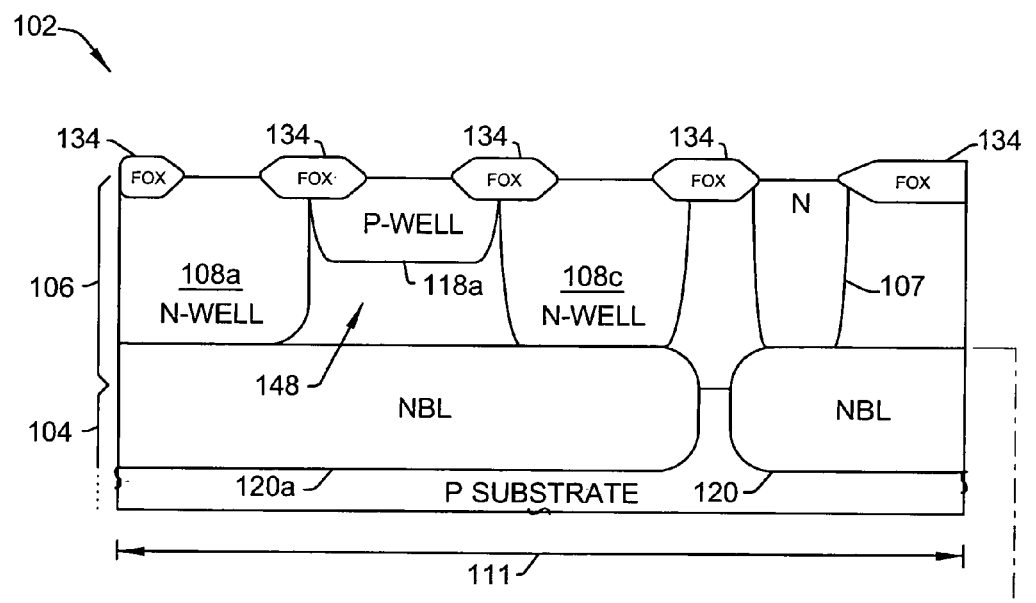
Figure 5G:
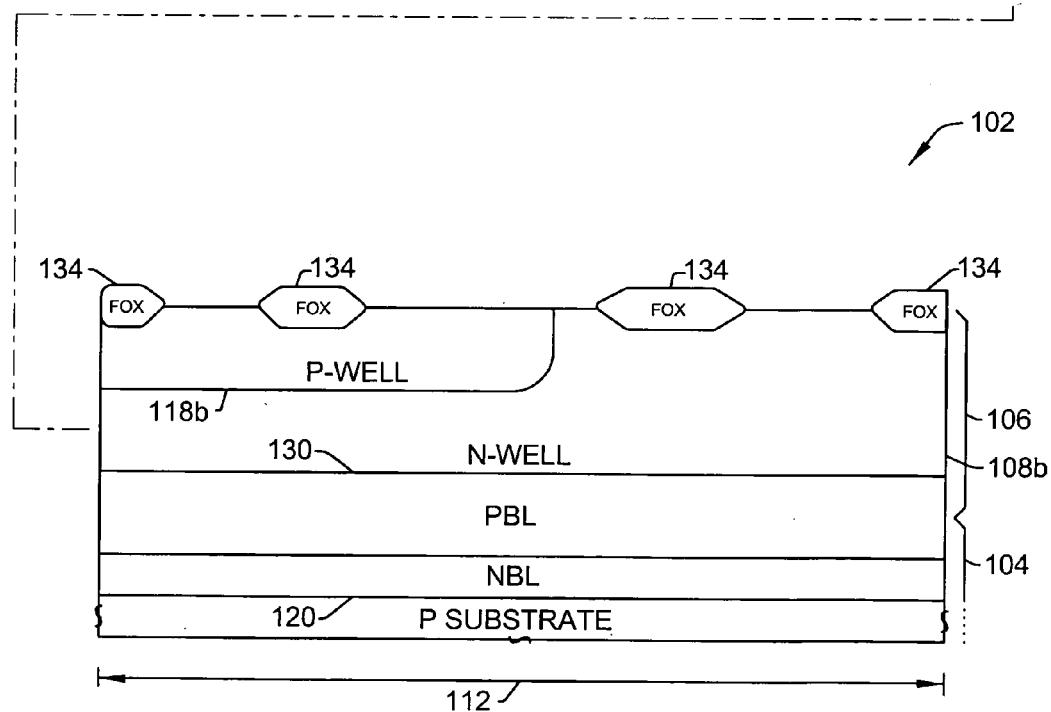
Figure 5H:
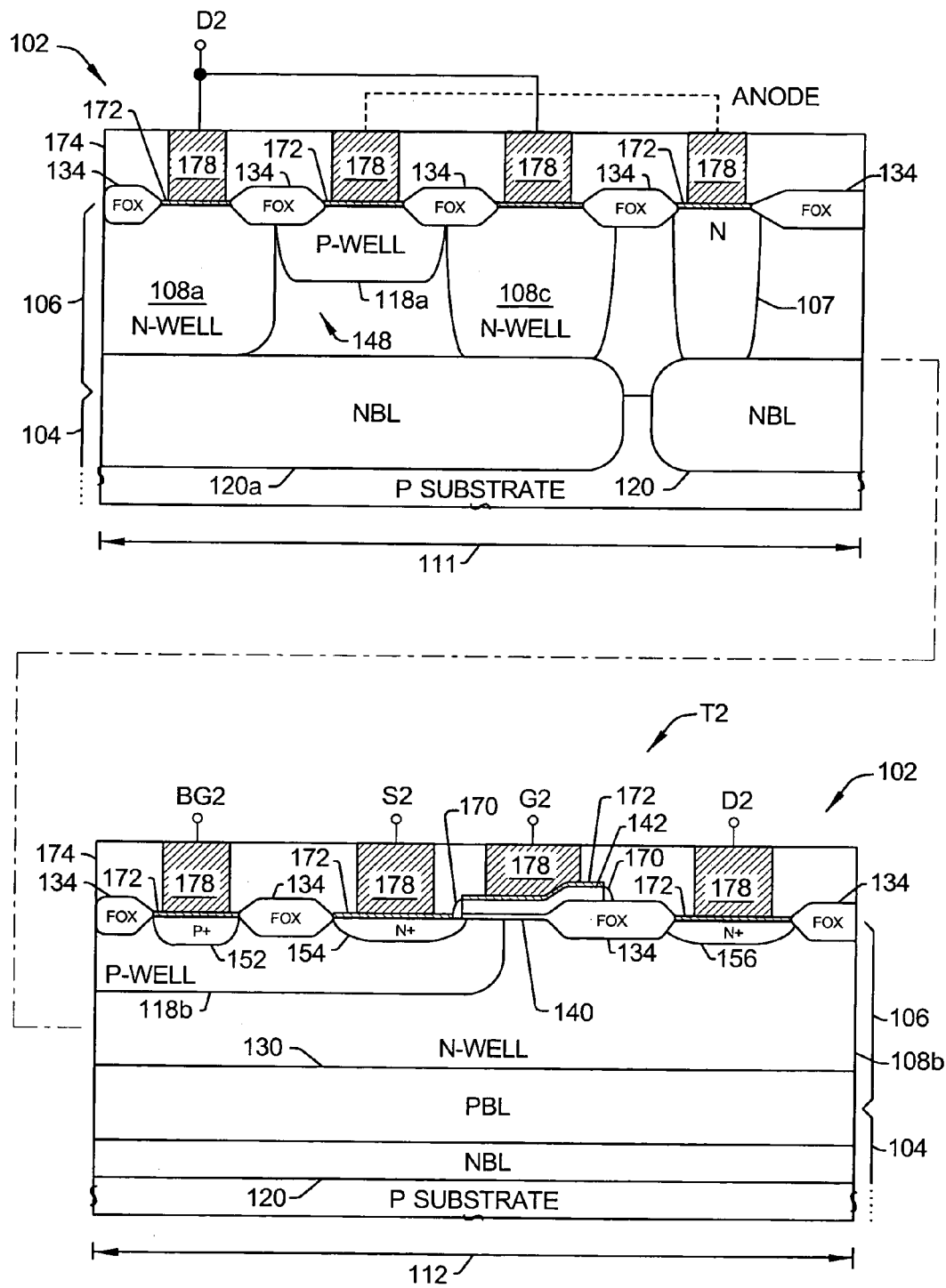

At 222 in FIG. 4, isolation structures 134 are formed using any suitable techniques, such as local oxidation of silicon (LOCOS), shallow trench isolation techniques (STI), deposited oxide, etc. In the exemplary device 102, field oxide (FOX) structures 134 are formed for both the diode and high side regions 111 and 112, respectively, as illustrated in FIG. 5G. As illustrated in FIGS. 5H and 6D, a thin gate oxide 140 is formed (e.g. at 224 in the method 202) over the device upper surface, for example, by thermal oxidation processing, and a gate polysilicon layer 142 is deposited at 226 over the thin gate oxide 140. The gate oxide 140 and the polysilicon 142 are patterned at 228 to form a gate structure extending over channel region of the p-well 118b in FIG. 5H (p-well 118 in FIG. 6D).

With the patterned gate structure formed, LDD and/or MDD implants may be performed and sidewall spacers are formed at 230 along the lateral sidewalls of the patterned gate structure. At 232, the source and drain regions 154 and 156 are implanted with n-type dopants, and the back gate 152 is implanted with p-type dopants at 234, wherein any suitable masks and implantation processes may be used in forming the n-type source 154 and drain 156 and the p-type back gate 152. Silicide, metalization, and other back-end processing are then performed at 236 and 238, respectively, to create conductive metal silicide material 172 and conductive plugs 178 (e.g., tungsten, etc.) in a first pre-metal dielectric (PMD) layer 174 over the gate 142, source 154, drain 156, and back-gate 152 of the DEMOS transistor T2, as well as over the p-type anode 118a and the n-type cathode 118a in the case of an internal diode 148 (FIG. 5H).

Further metalization layers (not shown) are then formed to create a multilevel interconnect routing structure at 240, after which the method 202 ends at 240 in FIG. 4. In the internal diode case, the n-buried layer 120 is coupled with the anode p-well 118a through the n-type sinker 107 and the conductive contact plugs 178 above the sinker 107 and the anode 118a, which can then be connected in an overlying metalization layer, as illustrated schematically in FIG. 5H. Where an external diode 148 is to be used, an external anode connection is provided from the metalization routing to connect the diode 148 to the n-buried layer 120, and an external drain connection is provided from D2 to connect with the cathode of the diode 148, as illustrated in FIG. 6D.

Figure 6E:
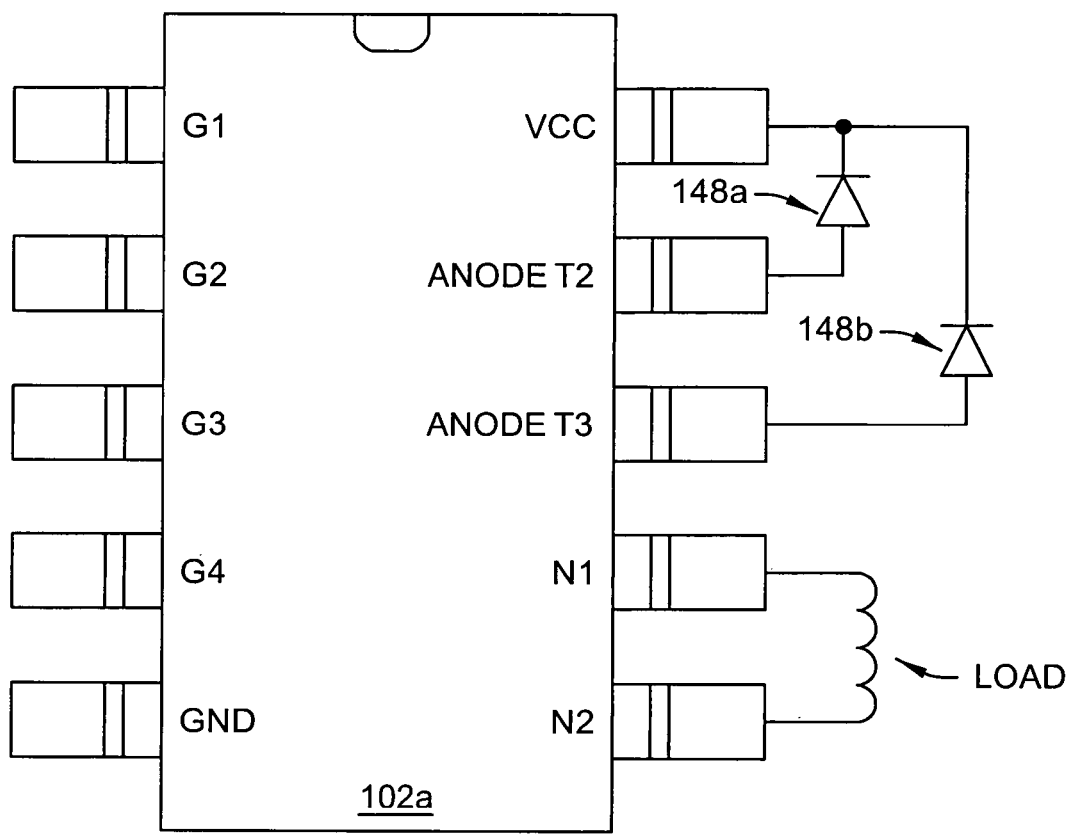
FIG. 6E is a top plan view illustrating a single-chip implementation of the full H-bridge circuit device of FIG. 1 having external diode connections in accordance with the invention.
Figure 6F:
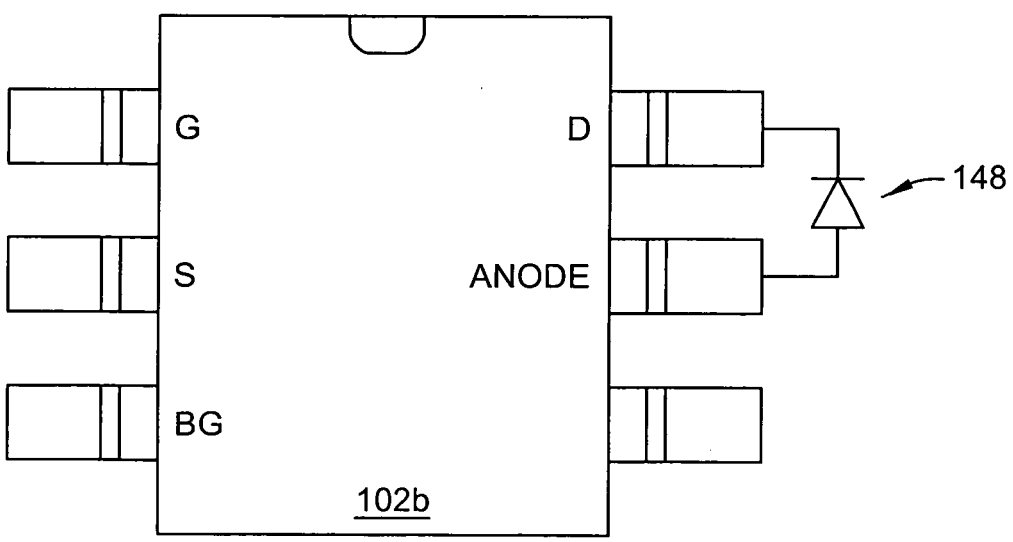
FIG. 6F is a top plan view illustrating an implementation of a single high-side driver transistor having an external connection for an external diode according to the invention.

FIGS. 6E and 6F illustrate two possible finished semiconductor devices 102a and 102b, respectively, providing external connections for the anode and cathode of the external diode 148. FIG. 6E illustrates an exemplary a single-chip implementation 102a of the full H-bridge circuit device of FIG. 1 having external diode connections for coupling diodes 148a and 148b between the n-buried layers 120 (anode) and the extended drains (cathode) of the high-side driver DEMOS transistors T2 and T3, respectively in accordance with the invention. FIG. 6F illustrates another exemplary device 102b, comprising a single high-side driver transistor (e.g., T2) having an external anode connection for coupling an external diode 148 between the n-buried layer 120 and the drain 156.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A drain-extended MOS transistor, comprising:
   a source of a first conductivity type formed in a semiconductor body;
   a drain of the first conductivity type laterally spaced from the source in the semiconductor body;
   a drift region of the first conductivity type located between the drain and the source in the semiconductor body;
   a channel region of a second conductivity type extending between the drift region and the source in the semiconductor body, wherein the drift region extends between the channel region and the drain;
   a gate located above the channel region;
   a first buried layer of the first conductivity type located below the source, the channel region, and the drift region, the first buried layer being separated from the drift region and from the drain;
   a diode having an anode coupled with the first buried layer and a cathode coupled with at least one of the drift region and the drain; and
   a second buried layer of the second conductivity type located below the source, the channel region, and the drift region, wherein the second buried layer separates the first buried layer from the drain and the drift region, and wherein the diode is separated from and not directly coupled to the second buried layer.

2. The transistor of claim 1, wherein the semiconductor body comprises a silicon substrate and an epitaxial silicon layer formed above the silicon substrate, wherein the source, the drain, the channel region, and the drift region are located in the epitaxial silicon layer, and wherein at least a portion of the second buried layer is located in the silicon substrate.

3. The transistor of claim 2, wherein the diode is formed in the epitaxial silicon layer.

4. The transistor of claim 1, wherein the first buried layer is located below at least a portion of the second buried layer.

5. The transistor of claim 1, comprising a first well of the first conductivity type extending in the semiconductor body below the source, the drain, and the channel, wherein the second buried layer is located below the first well.

6. The transistor of claim 5, comprising a second well of the second conductivity type located within the first well, the second well extending below the source and the gate, wherein a portion of the first well extends between the second well and the second buried layer.

7. The transistor of claim 1, wherein the diode is formed in the semiconductor body.

8. The transistor of claim 1, wherein the first conductivity type is n-type and the second conductivity type is p-type.

9. A semiconductor device, comprising:
a semiconductor body;
a drain-extended MOS transistor comprising an extended drain of a first conductivity type formed in the semiconductor body;
a first buried layer of the first conductivity type located in the semiconductor body below the drain-extended MOS transistor, the first buried layer being separated from the drain-extended MOS transistor;
a second buried layer of a second conductivity type located below the drain-extended MOS transistor, wherein the second buried layer separates the first buried layer from the drain-extended MOS transistor; and
a diode directly coupled between the first buried layer and the extended drain and not directly coupled to the second buried layer.

10. The semiconductor device of claim 9, wherein the semiconductor body comprises a silicon substrate and an epitaxial silicon layer formed above the silicon substrate, wherein the drain-extended MOS transistor is located in the epitaxial silicon layer, and wherein at least a portion of the second buried layer is located in the silicon substrate.

11. The semiconductor device of claim 9, wherein the first conductivity type is n-type and the second conductivity type is p-type.

* * * * *